(12) United States Patent
Brey et al.

(10) Patent No.: US 7,676,301 B2
(45) Date of Patent: Mar. 9, 2010

(54) IDENTIFICATION AND CHARACTERIZATION OF RECIRCULATION IN ELECTRONIC SYSTEMS

(75) Inventors: Thomas M. Brey, Cary, NC (US); Richard Edwin Harper, Chapel Hill, NC (US); Thomas Dixon Pahel, Jr., Raleigh, NC (US); William Joseph Piazza, Holly Springs, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 12/116,163

(22) Filed: May 6, 2008

(65) Prior Publication Data
US 2008/0300818 A1 Dec. 4, 2008

Related U.S. Application Data

(63) Continuation of application No. 11/755,889, filed on May 31, 2007, now Pat. No. 7,463,950.

(51) Int. Cl.
G06F 19/00 (2006.01)
(52) U.S. Cl. ........................ 700/299; 700/276; 702/130; 702/188; 361/395; 340/524
(58) Field of Classification Search ................. 700/276, 700/299; 702/127, 130, 188, 194; 454/186; 361/695; 340/501, 506, 524; 236/49.3, 49.5
See application file for complete search history.

(56) References Cited

U.S. PATENT DOCUMENTS 4,874,127 A   10/1989  Collier
6,283,380 B1   9/2001  Nakanishi et al.
6,574,104 B2   6/2003  Patel et al.
6,881,142 B1 * 4/2005  Nair ........................... 454/186
7,006,949 B2   2/2006  Moore
7,031,870 B2 * 4/2006  Sharma et al. .............. 702/130
7,057,506 B2 * 6/2006  Bash et al. .................. 340/524

(Continued)

OTHER PUBLICATIONS

Montgomery, WS and Zlome, LL; Environmental Monitoring and Control System for Clean Room Heating; 1993; 3 pages; San Jose.

(Continued)

*Primary Examiner*—Albert DeCady
*Assistant Examiner*—Douglas S Lee
(74) *Attorney, Agent, or Firm*—Cynthia G. Seal; Jeffrey L. Streets (57) ABSTRACT

Systems and methods for detecting and analyzing elevated temperatures at a component rack to identify and characterize air recirculation anomalies. In one embodiment, temperatures are sensed in proximity to an air intake of the component rack. Temperature sensors communicate with a workstation having system management software including a thermal management component for analyzing air intake temperatures. Predefined temperature differentials (PTD) are established, corresponding to expected temperature differentials between the selected locations in the absence of any appreciable recirculation. The PTD provides a threshold for comparing with "actual" temperature differentials (ATD) to identify the presence and/or mode of recirculation. If an ATD exceeds a corresponding PTD for a predefined time interval, a signal is output. The mode of recirculation, such as left-side, right-side, or dual-surface recirculation, may be determined using as few as four temperature sensors positioned at a zone of interest (ZOI).

15 Claims, 6 Drawing Sheets

U.S. PATENT DOCUMENTS

| | | | |
|---|---|---|---|
| 7,086,603 B2 | | 8/2006 | Bash et al. |
| 7,117,129 B1* | | 10/2006 | Bash et al. ................. 702/194 |
| 2006/0091229 A1* | | 5/2006 | Bash et al. ................. 236/49.3 |
| 2006/0225446 A1* | | 10/2006 | Bash et al. ................... 62/178 |

OTHER PUBLICATIONS

AVTECH Software, Inc.; Room Alert Introductions, Overview & Justification; 11 pages.

AVTECH Software; Pager Will Provide You And Your Organization With Many Important & Valuable Benefits; www.pagerenterprise.com; 1 page.

Keke Chen, David M. Auslander, Cullen E. Bash, Chandrakant D. Patel; Local Temperatures Control in Data Cooling: Part III, Application; Mar. 7, 2006; Palo Alto.

* cited by examiner

IDENTIFICATION AND CHARACTERIZATION OF RECIRCULATION IN ELECTRONIC SYSTEMS

CROSS-REFERENCE TO RELATED APPLICATIONS

This application is a continuation of co-pending U.S. patent application Ser. No. 11/755,889, filed on May 31, 2007.

BACKGROUND OF THE INVENTION

1. Field of the Invention

The present invention relates to cooling rack-mounted computer equipment, and more particularly to the detection of hot air recirculation and other airflow anomalies.

2. Description of the Related Art

An airflow anomaly is one type of fault scenario that may be experienced by a rack-mounted computer system. In the present context, an airflow anomaly may be defined to include any unexpected or non-ideal airflow condition affecting a computer system. Some airflow anomalies result in higher than expected air temperatures in a computer system. These elevated temperatures may prevent proper cooling of components, causing them to heat up more than expected and possibly exceed safe operating temperatures.

Elevated intake temperatures can occur when heated air from a first component rack is exhausted to a second component rack. The heated air exhausted from the first component rack may have detrimental effects on the cooling of the second rack. To avoid this complication, component racks may be arranged according to a "hot aisle" and "cold aisle" layout, whereby neighboring component racks intake air from a shared cold aisle and exhaust air to a common hot aisle. This arrangement helps minimize the likelihood of appreciable volumes of heated exhaust air from entering a neighboring component rack. If a data center includes more than one row of component racks, then there may be alternating hot and cold aisles with a component rack between each aisle. The orientation of the component racks is also alternated in that case, so that the intake side of each component rack faces a cold aisle and the exhaust side of each component rack faces a hot aisle.

Another, more common cause of hot air entering a component rack is the recirculation of heated air ("hot air recirculation"). Hot air recirculation (which may alternatively be referred to simply as "recirculation") is a phenomenon wherein hot exhaust air from a rack flows back to the air intake of the same rack without first being cooled as intended. Recirculation may be caused, for example, by an obstruction, such as a wall near the rack, which causes the exhaust air to flow around the side of a rack. Another condition that can cause recirculation is the insufficient rejection of hot air from behind a component rack, resulting in a heat plume which extends over the top and front of the rack and returns to the air intake of the component rack without having been sufficiently cooled. Still another cause of recirculation is the occurrence of gaps between the components in a component rack through which hot air is drawn due to the pressure differential between the front and rear panel of the rack.

Recirculation has been observed to increase intake air temperatures by 6 to 8 degrees Celsius in some installations. Recirculation can, therefore, negatively affect the cooling of a component, causing the components in a rack to run hotter than desired. This may result in shorter "Mean Time Between Failure" (MTBF), increased energy consumption due to increased fan speed, inefficient use of cool air, increased leakage current, and reduced thermal bandwidth for emergency operations. The additional heat introduced to the rack by recirculating air may also cause the components to exceed thermal thresholds, particularly if the components are operating in a room that is very warm to begin with, or if the amount of heating that takes place within the components is substantial. These elevated temperatures can cause one or more of the components to shut down or require them to be removed from service.

SUMMARY OF THE INVENTION

The invention includes systems and methods for identifying and characterizing recirculation in a rack-based computer system that houses a plurality of heat-generating components. In one embodiment, a plurality of temperature sensors is included in proximity to the air intake of the component rack. Airflow is established through the component rack from the air intake of the component rack to an air exhaust of the component rack. Air intake temperatures are monitored with the temperature sensors, and one or more temperature differentials are identified between any of the temperature sensors. A signal is output in response to any of the one or more temperature differentials exceeding a predetermined temperature differential for at least a predetermined time period.

In another embodiment, a computer program product comprises a computer usable medium including computer usable program code for diagnosing elevated temperature anomalies at the air intake to a component rack housing a plurality of heat-generating components. The computer program product includes computer usable program code for monitoring air intake temperatures with temperature sensors positioned in proximity to an air intake of the component rack, for identifying one or more temperature differentials between any of the temperature sensors, and for outputting a signal in response to any of the one or more temperature differentials exceeding a predetermined temperature differential for at least a predetermined time period.

In another embodiment, a system is provided for diagnosing elevated temperature anomalies at the air intake to a component rack housing a plurality of heat-generating components. A plurality of temperature sensors are positioned in proximity to an air intake of the component rack. An airflow system generates airflow through the component rack from the air intake of the component rack to an air exhaust panel of the component rack. A controller in communication with each of the temperature sensors monitor air intake temperatures, identifies one or more temperature differentials between any of the temperature sensors, and outputs a signal in response to any of the one or more temperature differentials exceeding a predetermined temperature differential for at least a predetermined time period.

Other embodiments, aspects, and advantages of the invention will be apparent from the following description and the appended claims.

DETAILED DESCRIPTION OF THE INVENTION

The present invention provides systems and methods for detecting and analyzing elevated temperatures at the air intake of a component rack to identify and characterize recirculation and other airflow anomalies. A plurality of temperature sensors are positioned at an air intake of the component rack. The temperature sensors may be positioned in a grid providing a regular spacing between temperature sensors, such as in an orderly array of rows and columns. The temperature sensors may be secured at selected locations in a variety of ways, such as by providing each component with one or more built-in temperature sensors. Alternatively, the temperature sensors may be mounted on a grillwork removably positioned at the air intake of the component rack. The temperature sensors can even mounted directly to the rack. Still another alternative is to direct remotely positioned infrared temperature sensors at the selected locations of the air intake. The temperature sensors are in communication with a controller for analyzing the air intake temperatures. The controller may be a remote workstation networked with the rack-mounted components for global management of the rack-mounted components according to the air intake temperatures. Alternatively, the controller may, collectively, include the service processors or system management agents residing on the rack-mounted components, whereby the air intake temperature analysis may be performed "locally" by the rack-mounted components and send any alerts to the remote workstation.

Airflow is established through the component rack from the air intake of the component rack to an air exhaust of the component rack. A predefined temperature differential (PTD) is established as a threshold for the detection of potential recirculation. The PTD is an expected temperature differential between any two of the selected locations in the absence of any appreciable recirculation or other airflow anomaly. Air intake temperatures are then monitored at the selected locations. An "actual" temperature differential (ATD) is identified as the difference between the temperatures sensed at two locations. The ATD is compared with the corresponding PTD to identify the presence and/or mode of recirculation. If an ATD exceeds the threshold established by a corresponding PTD for at least a predefined time interval, an alert signal is generated in response.

The mode of recirculation may be determined using the data from the temperature sensors positioned at a zone of interest (ZOI). The ZOI may be any selected zone of the air intake. For example, the ZOI may be a single component bay, a selected grouping of component bays, or even the entire front face of a component rack or an aisle of component racks. A temperature sensor may be positioned at as few as two corners of the ZOI. A more detailed and informative analysis may be obtained with additional temperature sensors, such as by positioning a temperature sensor at each of the four corners of the ZOI. A rectangular ZOI provides a convenient demarcation, but is not required. For example, in one scenario, temperatures on the left side of a rectangular ZOI are substantially the same (ADT<PDT for the left-side sensors), while temperatures on the right side of the ZOI exceed the temperatures on the left side by at least the corresponding PTD(s) between left-side sensor(s) and right-side sensor(s). In response to identification of this condition, an alert may be generated indicating potential right-side recirculation.

A more complex, dual-surface recirculation mode may also be detected according to the invention. For example, using as few as four temperature sensors, one temperature sensor may be placed at each of the four corners of a rectangular ZOI. If each temperature at three corners exceeds the temperature at the fourth corner by at least the associated PTDs, an alert may be generated indicating potential dual-surface recirculation, wherein hot air is recirculating along two adjoining surfaces. For instance, if the air intake temperature at the bottom right corner of a rack-mounted component is cooler than the temperature at each of the other three corners by at least the associated PTDs (thresholds), then the alert may indicate potential dual-surface recirculation along the upper and left-side surfaces of at least that component. The alert may also provide a clue as to potential airflow problems on a larger scale, such as left/upper recirculation about the entire rack.

To facilitate diagnosis of such a larger scale problem (i.e. an airflow mode outside a particular ZOI), the analysis at one ZOI may be compared with the analysis of other ZOIs. For instance, the left/upper recirculation mode demonstrated by one component may be compared with the recirculation mode of neighboring components. If the neighboring components also exhibit an upper/left recirculation mode, that evidence would tend to support the conclusion of upper/left recirculation for the entire rack. Such clues may be supplemented by other data, such as the topology of the system. For example, knowledge that the component exhibiting upper/left recirculation is relatively close to the upper/left position of a rack on the far left side of an aisle tends to support a finding that the entire rack or aisle is experiencing upper/left recirculation, rather than the component in isolation.

Figure 1:
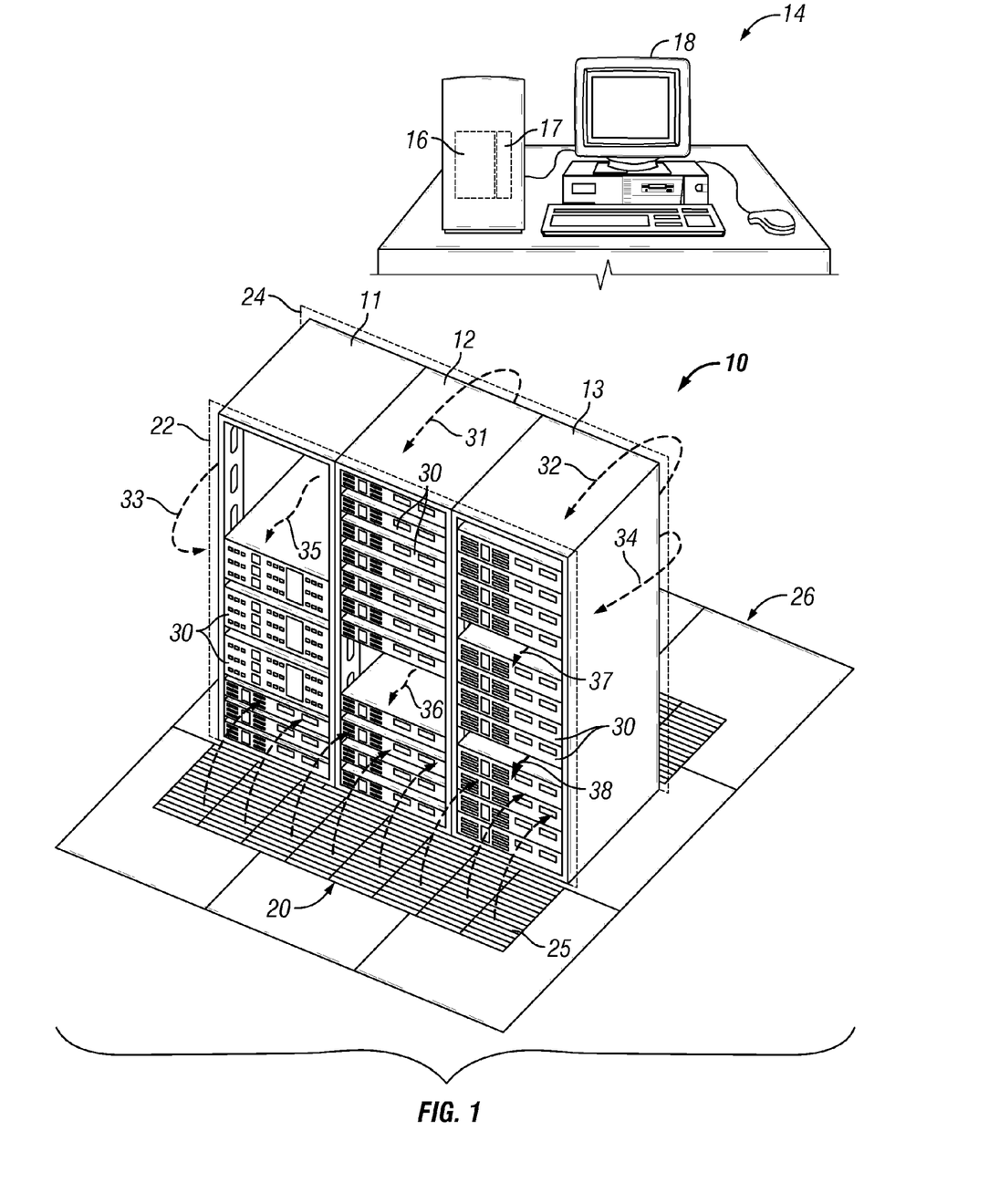
FIG. 1 is a perspective view of a rack-based computer system ("rack system") that includes a row of three component racks ("racks") arranged side-by-side.

FIG. 1 is a perspective view of a rack-based computer system ("rack system") 10 that includes a row of three component racks ("racks") 11, 12, 13 arranged side-by-side. Each component rack 11, 12, 13 has multiple components 30 disposed therein. The components 30 include heat-generating electronic components, such as servers, data storage devices, and communication network routers. The rack system 10 and/or the individual components 30 typically include one or more blowers (not shown) for generating airflow through the rack system 10, to cool the components within the rack system 10. A "cold aisle" 20 supplies relatively cool, air-conditioned air to an air intake 22 located at the front of the rack system 10. The air intake 22 spans the front face of the rack system 10. The air intake 22 may be made up of one or more rack panels or individual component panels. The air is heated by the heat-generating components 30 while passing through the rack system 10. The heated air is then exhausted to a hot aisle 26 through an air exhaust panel 24, which is the rear face of the rack system 10. The air exhaust panel 24 may be made up of one or more panels, such as back panels of the racks or individual components 30 mounted thereon. The heated air exhaust then enters a computer room air conditioning system (CRAC) known in the art, typically through ductwork located above the equipment near the ceiling. The CRAC cools and conditions the air, returning the cooled air through a grating 25 at the cold aisle 20. By virtue of this dynamic conditioning of air by the CRAC, the rack system 10 receives, in the absence of recirculation, a steady, consistent, supply of cool air having a generally predictable and uniform air temperature.

A complex airflow pattern including various recirculation modes are indicated by arrows representing airstreams about the rack system 10. A number of different "modes" of hot air recirculation are present in FIG. 1. A hot air recirculation mode is one way to characterize a particular form or manifestation of hot air recirculation. Here, air streams 31, 32 indicate what may be termed an "upper-level" mode of recirculation, wherein some hot air recirculates up and over the top of the rack system 10, rather than flowing as intended to the CRAC. Thus, the heated air in air streams 31, 32 reenters the rack system 10 through the air intake 22 without having first been cooled by the CRAC. Other air streams 33, 34 are routed along the left and right sides of the rack system 10, respectively, which is characteristic of "left-side" and "right-side" recirculation modes, respectively. In yet another mode of recirculation, air flows along air streams 35, 36, 37, and 38 from the back of the rack system 10, through empty component bays, and to the front of the rack system 10. Ordinarily, these rack openings could be blocked off by securing blank filler panels to the racks 11, 12, 13, although this practice is not always adhered to. Because the blank filler panels are left off, the pressure difference created by fans within the rack mounted components 50 can force heated exhaust air to travel forward through the rack to the front of the equipment, where it is drawn back into the rack system 10. As a result of the various recirculation modes present in the rack system 10, the air supply to the air intake 22 is less uniform than it otherwise would be, and higher than expected air temperatures may, therefore, be present at the air intake 22. It should be recognized that these recirculation modes are representative only, that other modes may exist, that any one or more of these modes may occur together, and that there may be no recirculation at any given point in time.

A computer workstation 14 is networked with the components 30, and includes system management software 16 for monitoring and controlling the components 30 and other equipment in the data center. Non-limiting examples of system management software applications include IBM Netfinity Manager, IBM Netfinity Director, Tivoli TME 10, and Compaq Insight Manager. In addition to automatically monitoring and controlling the rack system 10, the system management software 16 may also alert the system administrator 18 if and when intervention is required for a particular component 30. A system management agent may be installed on one or more of the components 30 for controlling the components 30 locally, on its own initiative according to its own programming and/or in accordance with instructions from the system management software 16. The workstation 14 and the system management software 16 may receive a variety of different inputs from various sensors and components, including temperatures (e.g. air intake and otherwise), airflow rates, processor activity levels, and so forth. The system management software 16 cooperates with the system management agents to control the components 30, possibly in response to or as a function of input from the system administrator 18 and/or as a function of one or more system parameters monitored by the workstation 14. For example, the workstation 14 may selectively monitor and control the power distribution among the components 30, adjust blower speeds and associated airflow rates as needed for properly cooling the rack system 10 and/or its components 30, throttle the components 30, or individually power the components 30 ON or OFF.

The system management software also generates alerts, as needed, for the attention of the system administrator. If certain conditions are detected in a component 30, the system management software 16 may inform the system administrator of the conditions, such as by generating an alert including a warning message or a visual description of the conditions on a display 18 of the workstation 14. A wide variety of fault scenarios or conditions may trigger an alert, only one example of which is recirculation. Additional fault scenarios or conditions presently known in the art may also be monitored. The alert may include an identification of the affected components 30 and their detected condition(s) and positions. The system administrator may use this information to locate the component(s) 30 that is/are the subject of the message. The system management software 16 is optionally capable of presenting a graphical representation of the physical location of the component to the system administrator. In response to an alert, the administrator may make changes to the configuration of the datacenter. Such actions may include moving racks or components to alternate locations, upgrading the size of the CRAC units, blowers, and/or fans, installing blank panels to cover empty component bays, and/or redistributing workload (e.g. application programs) within the data center.

Figure 2:
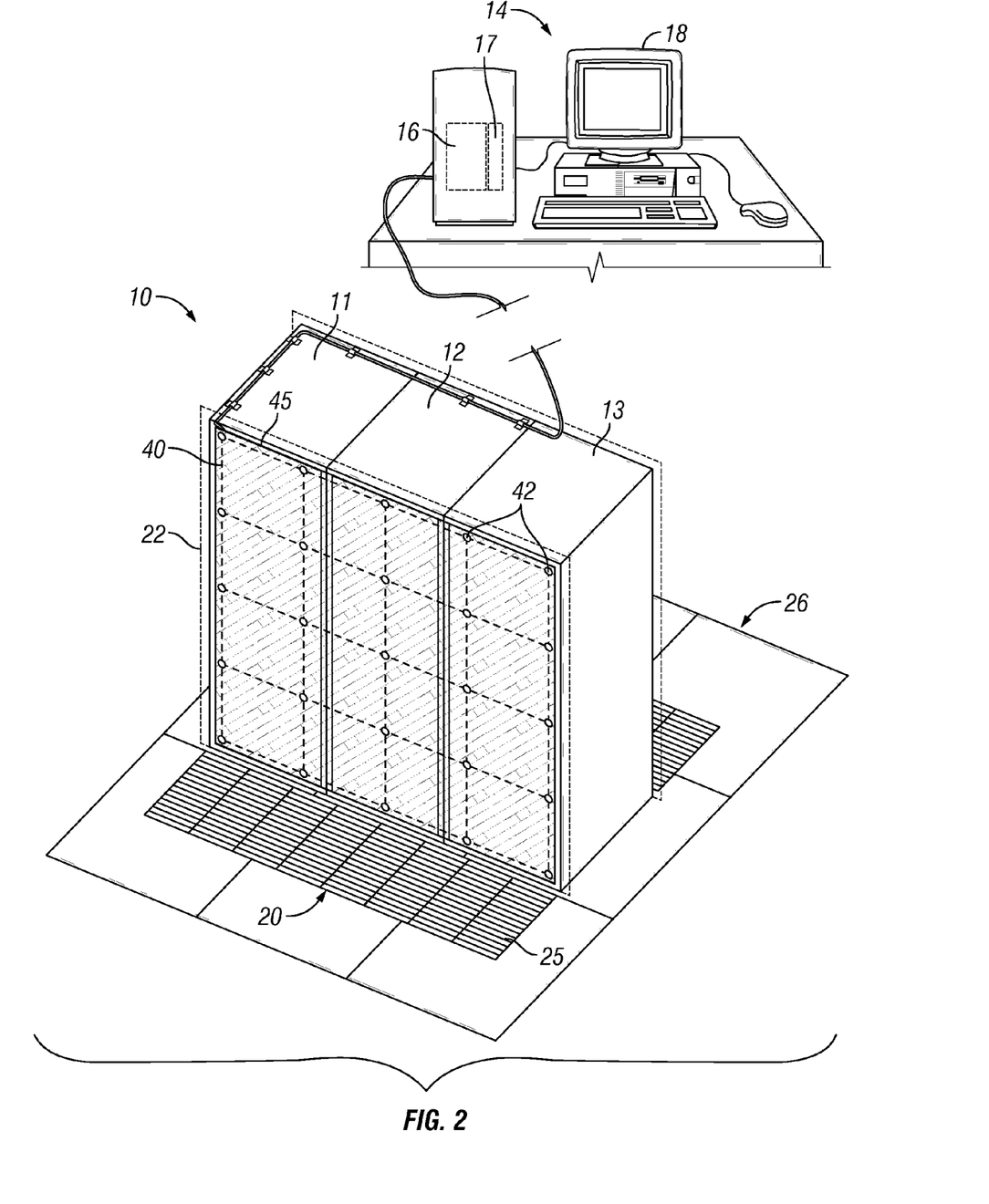
FIG. 2 is a perspective view of the rack system, configured according to the invention with a plurality of temperature sensors for sensing air intake temperatures and a thermal management module operating on a workstation for analyzing the air intake temperatures.

FIG. 2 is a perspective view of the rack system 10, configured according to the invention with a plurality of temperature sensors 42 for sensing air intake temperatures and a thermal management module 17 on the workstation 14 for analyzing the air intake temperatures. The thermal management module 17 may be included with the system management software 16, for example, as a plug-in or add-on to the system management software 16. The thermal management module 17 cooperates with the system management software 16 to alert the system administrator of potential airflow anomalies. The thermal management module 17 may generate alerts in response to elevated or otherwise abnormal temperature conditions. The system management software 16 may analyze the air intake temperatures to diagnose one or more airflow patterns or airflow anomalies at the rack system 10. For example, the system management software 16 may analyze the air intake temperatures to detect air patterns consistent with recirculation. The system management software 16 may also output or suggest possible recirculation modes in order to assist the system administrator toward implementing appropriate counter measures.

It should be recognized that air intake temperatures may be only one of several parameters monitored by the workstation 14 in the embodiment of FIG. 2. Likewise, controlling rack-mounted components in response to air intake temperatures may be only one of many different functions provided by the workstation 14. Other functions presently known in the art may additionally be performed by the workstation 14. In another embodiment, systems other than the workstation 14 may alternatively monitor and analyze air intake temperatures. For example, service processors residing locally on the rack-mounted components may monitor and analyze air intake temperatures. The rack-mounted components may then generate an alert and optionally send the alert to the workstation 14. In still another embodiment, responsibility for monitoring and analyzing air intake temperatures may be shared between the workstation 14 and the rack-mounted components. For example, system management agents locally residing on the rack-mounted components may cooperate with the system management software 16 to monitor and analyze air intake temperatures and control the rack-mounted components in response.

Referring still to the embodiment of FIG. 2, the workstation 14 is wired in electronic communication with the temperature sensors 42. The temperature sensors 42 are positioned at the air intake 22, and are preferably spaced at least slightly away from, or otherwise thermally insulated from, the racks 11, 12, 13, and the components 30, so that the temperature sensors 42 predominantly sense air intake temperatures rather than the temperatures of the racks or hardware. In this embodiment, the temperature sensors 42 are optionally laid out according to a generally rectangular temperature sensor grid 40, with the temperature sensors 42 generally arranged in an orderly pattern of evenly spaced rows and columns. The temperature sensor grid 40 is a geometrical construct used as a reference in FIG. 2 to describe the physical positioning of the temperature sensors 42, and does not necessarily have a structural component, nor imply the need for a direct physical or electrical interconnection between the sensors 42.

In one configuration, the temperature sensors 42 may be included with the components 30. For example, each component 30 may include a temperature sensor at each of four corners of the component 30. Alternatively, the temperature sensors may be individually secured to the components racks 11, 12, 13. In yet another configuration, the temperature sensors 42 may optionally be positioned on and secured to a removable screen, frame, or grill ("grillwork") 45 that defines a plane of the temperature sensor grid 40. The grillwork 45 may comprise an open framework, or a screen, mesh, or other breathable material that allows air to flow through the grillwork 45 into the rack system 10. The temperature sensors 42 may be secured to the grillwork 45 at the desired spacing between the temperature sensors 42. The grillwork 45 may be used to removably position the temperature sensors 42 as a group, avoiding the need to individually position the temperature sensors 42 in front of the rack system 10. The grillwork 45 may be removed as needed from the front of the rack system 10, along with the attached temperature sensors 42, such as to access the components 30. Thus, the grillwork 45 facilitates quickly and easily positioning the temperature sensors 42 with the desired spacing between the temperature sensors 42 and with the desired spacing from the component racks 11, 12, 13.

A total of twenty-five temperature sensors 42 are shown in the embodiment of FIG. 2. However, any number of temperature sensors 42 may be used. There may be four temperature sensors per zone of interest. For example, a temperature sensor may be installed at each of four corners of each component. Though four or fewer temperature sensors may be used to identify recirculation within a given zone of interest, the distribution of a larger number of temperature sensors in proximity to the air intake 22 may provide greater reliability and resolution in identifying a temperature distribution along the air intake 22.

Figure 3:
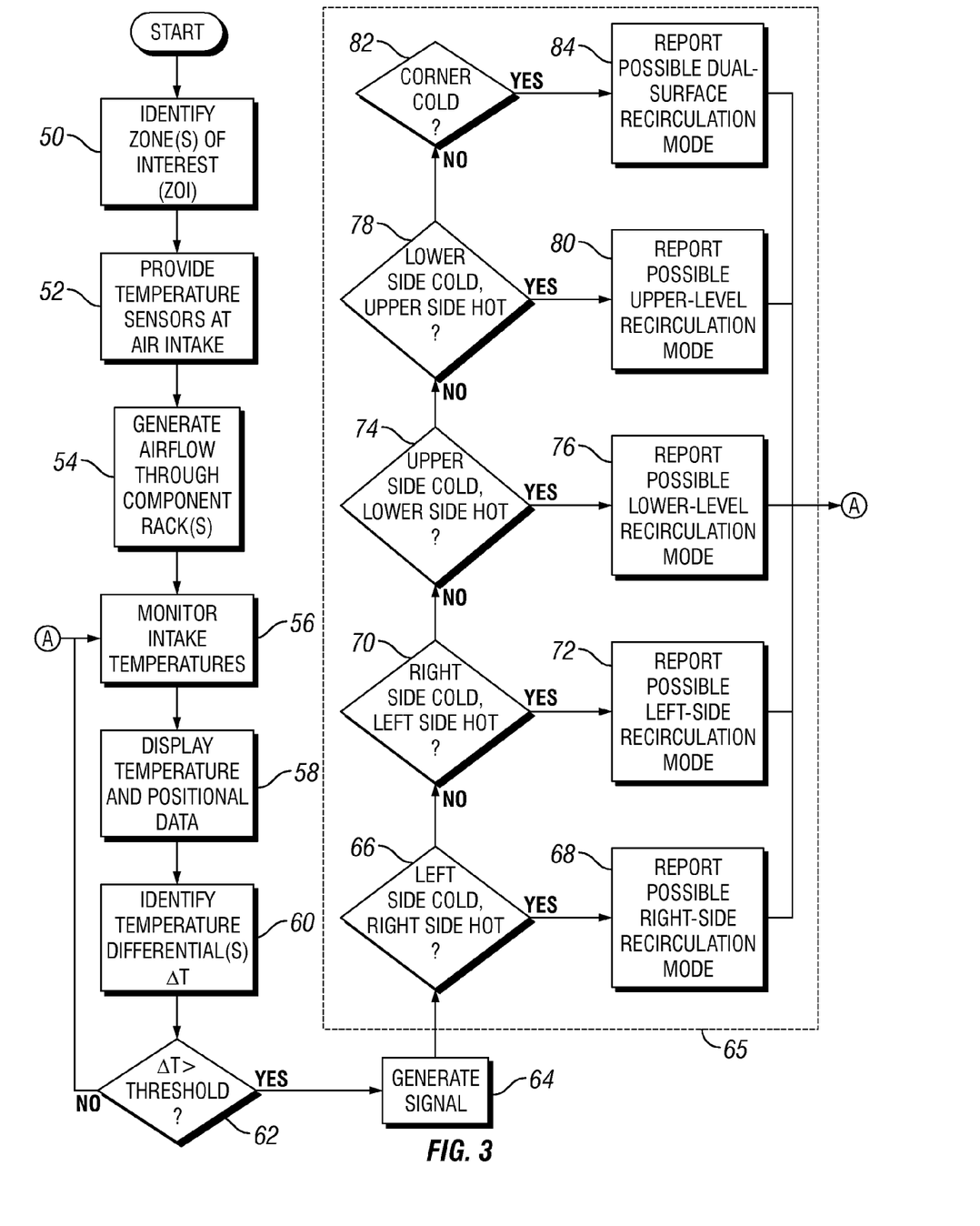
FIG. 3 is a flowchart outlining a method of detecting and analyzing elevated intake temperatures according to an embodiment of the invention that may be implemented, for example, on the rack system in FIG. 2.

FIG. 3 is a flowchart outlining a method of detecting and analyzing elevated intake temperatures in a rack-based computer system according to one embodiment of the invention. This method may be used, for example, to monitor and analyze air intake temperatures at the rack system 10 as configured in FIG. 2. Again, the monitoring and analysis of air intake temperatures may be performed globally using a remote workstation or computer system, locally using service processors residing on the rack-mounted components, or cooperatively between a remote workstation running system management software and local service processors or management agents residing on the rack-mounted components. In step 50, one or more zone of interest (ZOI) to be monitored is identified. The ZOI may be a single component or component bay, a group of components or component bays, or even an entire component rack or wall of component racks.

In step 52, a plurality of temperature sensors are provided at the air intake (e.g. air intake 22) of the identified system, at selected locations in relation to the ZOI(s). For example, if a particular ZOI is the entire front face of the component rack, a temperature sensor may be provided at each corner of the air intake. At least one temperature sensor may also be positioned in front of or included with each of the rack-mounted components. A component may include several temperature sensors, such as one sensor at each corner of the component's front panel. The temperature sensors are preferably spaced from or at least thermally insulated from the components. The temperature sensors may be built-in to the rack-mounted components, so that positioning temperature sensors at these locations may occur "automatically." Thus, the built-in temperature sensors are inherently available to sense intake temperatures at the locations of the rack-mounted components.

Airflow through the component racks is established in step 54, typically using a plurality of fans or blowers included with the components and/or mounted on the racks. Air intake temperatures are sensed in step 56, and the sensed air temperatures are optionally displayed in step 58. In the absence of recirculation or other airflow anomaly, substantially uniform air temperatures might be expected across the air intake of the system. Thus, under ideal conditions, all of the temperature sensors at the air intake would report substantially identical air intake temperatures. An airflow anomaly such as recirculation will cause deviations from the expected temperatures. These deviations may manifest in the form of a temperature differential between two temperature sensors. Temperatures across the air intake might not be perfectly uniform, even in the absence of recirculation. However, temperatures should at least be uniform within a defined temperature range. Accordingly, one or more predefined temperature differential ("PTD") may be selected, each characterizing a maximum expected temperature differential between locations in the absence of hot air recirculation or other airflow anomalies. Each PTD may be associated with any two temperature sensors or their locations. For example, one PTD may be associated with adjacent temperature sensors to describe the maximum temperature differential expected between the adjacent temperature sensors. Another PTD may be associated with temperature sensors located in opposite corners of one side of a rectangular ZOI. Yet another PTD may be associated with temperature sensors located in diagonally opposite corners of the ZOI.

Each PTD (threshold) may be compared with an actual temperature differential ("ATD") identified in step 60. An actual temperature differential ("ATD") is the difference in temperature between two locations, which may be computed as the difference between temperatures reported by two of the temperature sensors. The ATD is compared with the PTD that is associated with the same two temperature sensors in step 62. Thus, each PTD may serve as a threshold with which an ATD is compared for identifying potential recirculation.

When an ATD exceeds the associated PTD, an alert signal may be generated in step 64. Brief temperature fluctuations may be dismissed, however. For example, a person walking by one of the racks may temporarily disturb the airflow enough to affect the sensed air intake temperatures by a few degrees for several seconds, but not long enough to significantly impact cooling of the rack system. Thus, a predefined time interval ("PTI") may also be selected, wherein the alert signal generated in step 64 occurs only when the PTD has been exceeded for at least the associated PTI.

In one example, a PTD of 3 degrees Celsius and an associated PTI of 15 seconds may be selected for a given ZOI. Thus, an alert may be generated if the temperatures sensed by two temperature sensors deviate by at least 3 degrees Celsius for more than 15 seconds. In some applications, a single PTD may be selected for an entire ZOI. Such an embodiment would be suitable for a system in which it is reasonable to expect a substantially uniform temperature (at least within the selected PTD(s)) throughout the ZOI, including from top to bottom, left to right. In another embodiment, different PTD may be associated with different pairs or sets of temperature sensors within a ZOI. For example, where the ZOI is an entire front face of a rack panel, equal air intake temperatures may be expected from left to right along the front face. Thus, the same PTD may be used for any horizontally spaced temperature sensors at a given height. In the same system, temperatures may be expected to increase in a vertical direction due to the tendency of warm air to rise and due to the positioning of a cooled air supply near the lower end of a rack. Thus, the PTD between two vertically spaced temperature sensors may be larger than the PTD between two horizontally spaced temperature sensors.

The sensed air intake temperatures may be analyzed according to a software object 65 for executing a temperature analysis subroutine. This temperature analysis subroutine 65 may be performed automatically by system management software or a component thereof, or manually by the system administrator upon reviewing the air intake temperatures. The temperature analysis subroutine 65 gives non-limiting examples of recirculation modes that may be detected. Conditional step 66 detects a condition wherein temperatures on the left side of a ZOI are cooler than temperatures on the right side by at least the associated PTD. In response, an alert may be generated indicating the presence of right-side recirculation in step 68. Similarly, conditional step 70 detects a condition wherein temperatures on the right side of the ZOI are cooler than temperatures on the left side by at least the associated PTD. In response, the system may generate an alert indicating the presence of left side recirculation in step 72. Conditional step 74 detects a condition wherein temperatures on the upper side of the rack are cooler than temperatures on the lower side of the rack. In response, the system may generate an alert indicating the presence of lower-level recirculation mode according to step 76. Conditional step 78 detects a condition wherein a lower side of the rack is cooler than the upper side by at least the predetermined temperature differential. In response, the system may generate an alert indicating the presence of upper-level recirculation according to step 78.

A more complex, dual-surface recirculation mode may also be detected according to the invention. Still referring to the temperature analysis subroutine 65, conditional step 82 detects a condition wherein the temperature at a particular corner of a selected ZOI (e.g. a generally rectangular air intake) is colder than temperatures at each of the other three corners of the ZOI. In response, the system may generate an alert indicating the presence of dual-surface recirculation according to step 84, wherein hot air is recirculating along two adjoining surfaces. For example, if air intake temperatures at the bottom right corner of the rack are substantially cooler than air intake temperatures at the left side of the rack and at the top of the rack by at least the associated PTD(s), then recirculation may be occurring predominantly on the upper and left surfaces of the rack.

FIGS. 4A through 4E are schematic diagrams further illustrating the analysis of intake air temperatures to deduce various recirculation modes in a selected zone of interest. More particularly, these figures illustrate the use of as few as four temperature sensors to provide a determination of potential airflow modes, including single- or multi-surface recirculation. In each of these five schematic diagrams, a temperature sensor 71-74 is positioned at each of the four corners of a generally rectangular zone of interest 70. The zone of interest 70 may be, for example, a component bay, a group of component bays, or an entire rack system.

A predetermined temperature differential (PTD) is selected (indicated in the figures as "ΔT"). The PTD may be selected, for example, using a "calibration" process, wherein a rack system is observed under conditions controlled to achieve an airflow that is substantially free of recirculation or other airflow anomalies. The air intake temperatures and temperature differentials may be observed from the data collected by the temperature sensors 71-74. For example, if a time-averaged maximum temperature differential between any of the sensors is 3 Celsius, the PTD may be set to 3 Celsius. Though different PTD may be associated with different pairs of temperature sensors, the examples of FIGS. 4A-4E assume a single PTD between each temperature sensor in the selected ZOI 70.

Figure 4A:
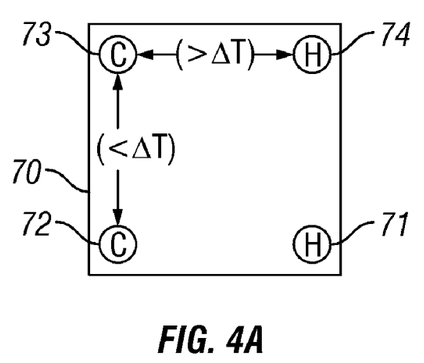
FIG. 4A is a schematic diagram illustrating the identification of a right-side recirculation anomaly using four temperature sensors.

FIG. 4A is a schematic diagram illustrating the identification of a right-side recirculation mode using the four temperature sensors 71-74. Temperatures sensed by the two left-side temperature sensors 72, 73 indicate that temperatures at the two left corners are less than temperatures at the two right corners sensed by the two right-side temperature sensors 71, 74. In particular, an actual temperature differential (ATD) between the temperature sensors 73 and 74 and an ATD between the temperature sensors 71, 72 are each greater than the PTD. An ATD between the temperature sensors 71, 74 and an ATD between the temperature sensors 72, 73 are each less than the PTD. This temperature distribution indicates that the right side of the zone of interest 70 is hotter than the left side of the zone of interest 70 by more than the PTD.

The scenario illustrated in FIG. 4A provides significant clues as to the airflow mode in and about the zone of interest 70. Where the selected zone of interest is the entire air intake of a component rack, for example, this temperature distribution may indicate circulation on the right side of the component rack. An alert may be generated, and a system administrator may check for causes of the right-side recirculation, such as the right side of the component rack being positioned too closely to a wall of a data center. In another example, where the zone of interest 70 is instead an individual component bay positioned somewhere in the middle of the component rack, this temperature distribution may instead indicate internal recirculation to the right of the component bay. This may be caused, for example, by an empty bay to the right of the zone of interest, where a filler panel has not been used and where hot air is recirculating through the empty bay to the zone of interest.

Figure 4B:
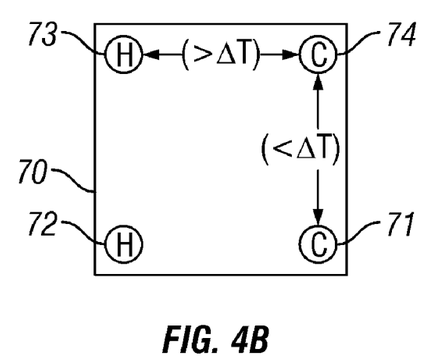
FIG. 4B is a schematic diagram illustrating the identification of a left-side recirculation anomaly using the four temperature sensors.
Figure 4C:
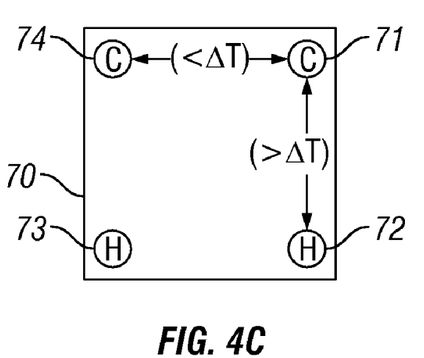
FIG. 4C is a schematic diagram illustrating the identification of a lower-level recirculation anomaly using the four temperature sensors.
Figure 4D:
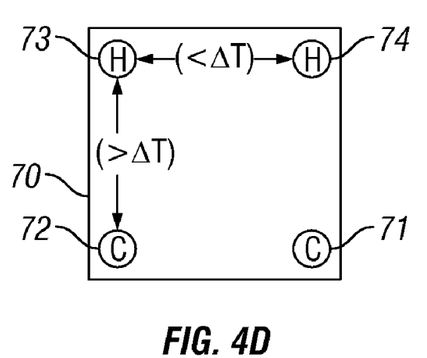
FIG. 4D is a schematic diagram illustrating the identification of an upper-level recirculation anomaly using the four temperature sensors.

Similar analysis may be applied to the temperature distributions described in FIGS. 4B-4D to determine airflow modes. FIG. 4B is a schematic diagram illustrating the identification of a left-side recirculation mode using the four temperature sensors 71-74. FIG. 4C is a schematic diagram illustrating the identification of a lower-level recirculation mode. FIG. 4D is a schematic diagram illustrating the identification of an upper-level recirculation mode.

Figure 4E:
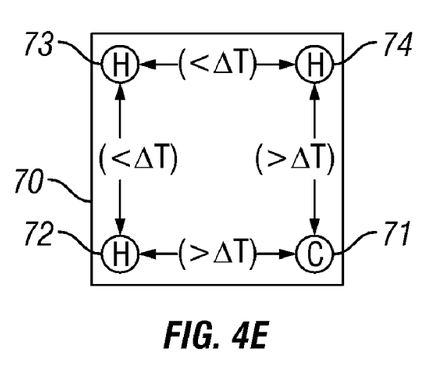
FIG. 4E is a schematic diagram illustrating the identification of a dual-surface recirculation anomaly using the four temperature sensors.

FIG. 4E is a schematic diagram illustrating the identification of a dual-surface recirculation mode using the four temperature sensors 71-74. The temperature sensor 71 senses that a temperature in the bottom-right corner of the ZOI 70 is cooler than temperatures at the other three corners, by an amount greater than the PTD. The temperature sensors 72, 73, 74 indicate that those three corners are all within the PTD of one another. This scenario, therefore, indicates hotter temperatures above and to the left of the zone of interest 70. For example, where the zone of interest 70 is the air intake of the entire component rack, this dual-surface recirculation mode indicates the possibility of recirculation above and to the left of the component rack.

Figure 5:
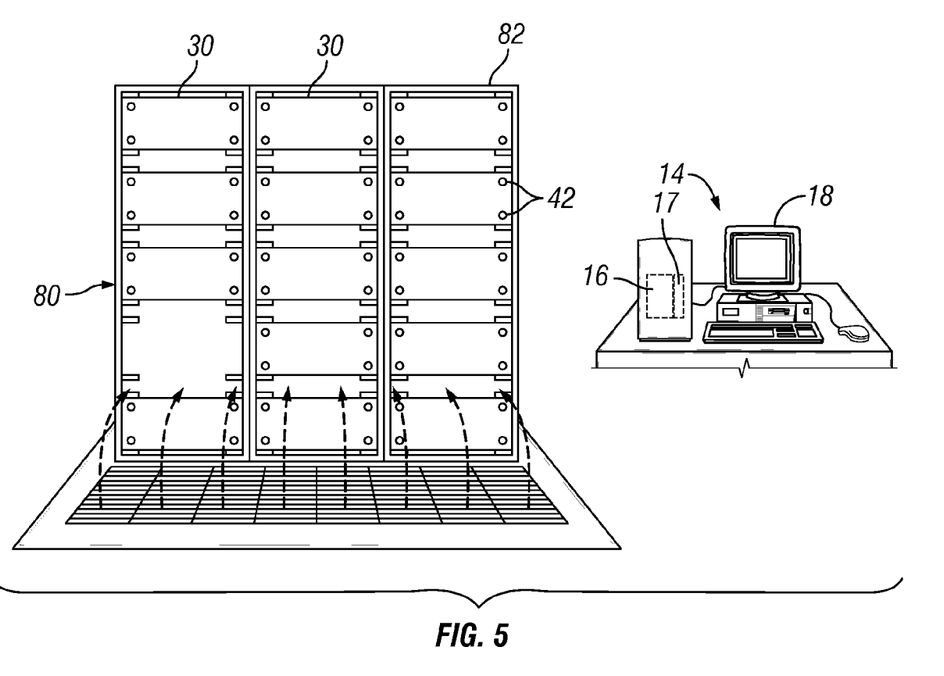
FIG. 5 is a schematic front view of a rack system according to another embodiment of the invention, wherein each component disposed in a rack has an included temperature sensor.

FIG. 5 is a schematic front view of a rack system 80 according to another embodiment of the invention, wherein each component 30 disposed in a rack 82 has an included temperature sensor 42 at each of four corners. For ease of illustration, all of the components 30 in this embodiment are assumed to be equally spaced and have equal dimensions. The temperature sensors 42 are optionally disposed on the components 30, albeit preferably insulated from the components 30 or otherwise configured so that the temperature sensors 42 sense air intake temperature in proximity to the respective components 30. A significant advantage of this embodiment is that the temperature sensors 42 may be built-in to each component 30, thus avoiding a time-consuming separate step of separately installing the temperature sensors 42. No separate grillwork is necessary either. The temperature sensors 42 may share the electronic communication channels of the components 30, such as using electronic connectors, ports, or wiring included with the components 30, for communication with the workstation 14. A visual display may be output, such as a chart or graph relating the temperatures sensed to the locations of the sensed temperatures.

A plurality of zones of interest may be selected for analysis, and the results of the analyses may be compared. For example, the front face of each of a plurality of components may be designated as a distinct zone of interest. The topology of the rack (or of multiple racks) may also be considered. To illustrate, an airflow mode may be determined for each of an upper row of components in adjacent racks. The identified airflow modes for each may be compared. If, for instance, each component in the upper row exhibits an upper-level mode of recirculation, the combined results tend to corroborate a finding that the entire grouping of adjacent racks is experiencing upper-level recirculation. If, instead, only one component in the row is demonstrating this behavior, the supported conclusion may be that the component is experiencing a more local, isolated airflow problem, such as hot air recirculation through a gap in one rack. The adjacent racks need not constitute an entire row, so for example three adjacent racks in the middle of a longer row of racks might be used to detect a heat plume extending over the tops of the racks but not affecting the entire row of racks.

It should be recognized that a zone of interest occupying less than the entire front face of a rack need not be confined to a specific component. For example, a zone of interest may extend from one component to another. To illustrate, a rectangular zone of interest in proximity to two side-by-side components may be demarcated by two right-side temperatures of the component on the left and two left-side temperature sensors of the component on the right. This ZOI could be used to identify an airflow anomaly extending across a gap between the two components. In one scenario, a first ZOI could be defined for the left component, a second ZOI could be defined for the right component, and a third ZOI would extend across the gap between the two components. If, for example, analysis of the first and second ZOI each demonstrate left-side recirculation, and analysis of the third ZOI shows that the temperatures at the left component are higher than temperatures at the right component, these combined analyses support a finding that a temperature distribution across the rack increases from right to left. This example also supports a finding that the entire rack is experiencing left-side recirculation.

The temperature sensors 42 have been illustrated as electro-mechanical elements positioned in proximity to an air intake in FIGS. 2 and 5. Another embodiment may, alternatively, include other types of temperature sensors such as one or more infrared (IR) temperature sensors. For example, the IR temperature sensors may be located apart from the rack system and aimed at the desired locations of the air intake for detecting temperatures at those desired locations. This advantageously provides non-contact temperature sensing at an array of target locations along an air intake of a rack system.

It should be recognized that the invention may take the form of an embodiment containing hardware and/or software elements. For example, hardware may include the workstation and the temperature sensors, and software may include the system management software and the thermal management module residing on the workstation. Non-limiting examples of software types include firmware, resident software, and microcode. More generally, the invention can take the form of a computer program product accessible on a computer-readable medium providing program code for use by or in connection with a computer or any instruction execution system. For the purposes of this description, a computer-usable or computer readable medium can be any apparatus that can contain, store, communicate, propagate or transport the program for use by or in connection with the instruction execution system, apparatus or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W), and DVD.

A data processing system suitable for storing and/or executing program code typically includes at least one processor coupled directly or indirectly to memory elements through a system bus. The memory elements can include local memory employed during actual execution of the program code, bulk storage, and cache memories that provide temporary storage of at least some program code in order to reduce the number of times code must be retrieved from bulk storage during execution. These elements may be included, for example, with the workstation 14 of FIG. 1.

Input/output (I/O) devices such as keyboards, displays, or pointing devices can be coupled to the system, either directly or through intervening I/O controllers. Network adapters may also be used to allow the data processing system to couple to other data processing systems or remote printers or storage devices, such as through intervening private or public networks. Modems, cable modems, Ethernet cards, and wireless network adapters are examples of network adapters.

Figure 6:
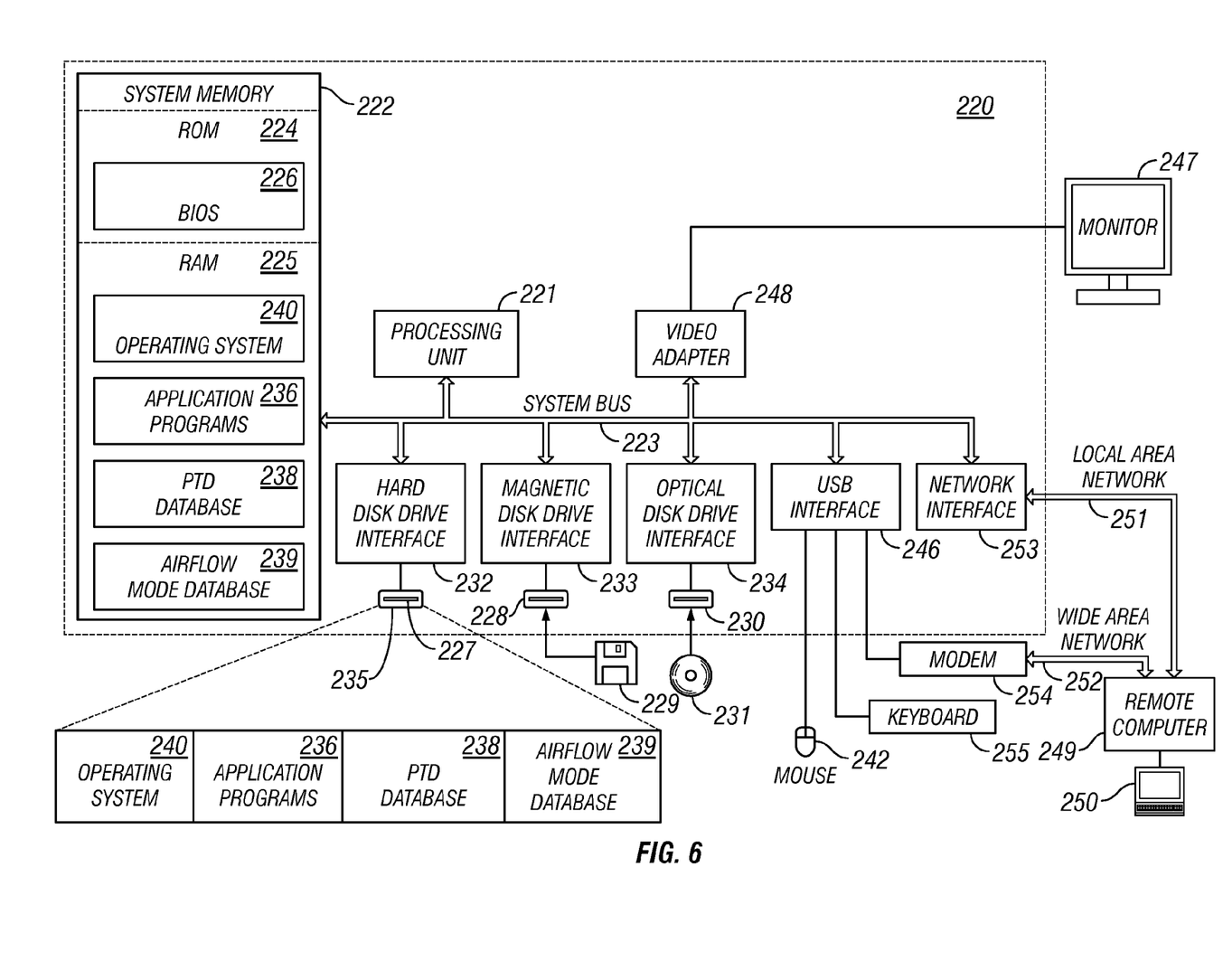
FIG. 6 is a schematic diagram of a computer system that may be configured for monitoring and analyzing air intake temperatures according to an embodiment of the invention.

FIG. 6 is a schematic diagram of a computer system generally indicated at 220 that may be configured for monitoring and analyzing air intake temperatures sensed by air temperature sensors according to an embodiment of the invention. The computer system 220 may be a general-purpose computing device in the form of a conventional computer system 220, such as the workstation 14 of FIGS. 1 and 2. Generally, computer system 220 includes a processing unit 221, a system memory 222, and a system bus 223 that couples various system components, including the system memory 222 to processing unit 221. System bus 223 may be any of several types of bus structures including a memory bus or memory controller, a peripheral bus, and a local bus using any of a variety of bus architectures. The system memory includes a read only memory (ROM) 224 and random access memory (RAM) 225. A basic input/output system (BIOS) 226 is stored in ROM 224, containing the basic routines that help to transfer information between elements within computer system 220, such as during start-up.

Computer system 220 further includes a hard disk drive 235 for reading from and writing to a hard disk 227, a magnetic disk drive 228 for reading from or writing to a removable magnetic disk 229, and an optical disk drive 230 for reading from or writing to a removable optical disk 231 such as a CD-R, CD-RW, DV-R, or DV-RW. Hard disk drive 235, magnetic disk drive 228, and optical disk drive 230 are connected to system bus 223 by a hard disk drive interface 232, a magnetic disk drive interface 233, and an optical disk drive interface 234, respectively. Although the exemplary environment described herein employs hard disk 227, removable magnetic disk 229, and removable optical disk 231, it should be appreciated by those skilled in the art that other types of computer readable media which can store data that is accessible by a computer, such as magnetic cassettes, flash memory cards, digital video disks, Bernoulli cartridges, RAMs, ROMs, USB Drives, and the like, may also be used in the exemplary operating environment. The drives and their associated computer readable media provide nonvolatile storage of computer-executable instructions, data structures, program modules, and other data for computer system 220. For example, the operating system 240 and application programs 236 may be stored in the RAM 225 and/or hard disk 227 of the computer system 220.

A user may enter commands and information into computer system 220 through input devices, such as a keyboard 255 and a mouse 242. Other input devices (not shown) may include a microphone, joystick, game pad, touch pad, satellite dish, scanner, or the like. These and other input devices are often connected to processing unit 222 through a USB (universal serial bus) 246 that is coupled to the system bus 223, but may be connected by other interfaces, such as a serial port interface, a parallel port, game port, or the like. A display device 247 may also be connected to system bus 223 via an interface, such as a video adapter 248. In addition to the monitor, personal computers typically include other peripheral output devices (not shown), such as speakers and printers.

The computer system 220 may operate in a networked environment using logical connections to one or more remote computers 249. Remote computer 249 may be another personal computer, a server, a client, a router, a network PC, a peer device, a mainframe, a personal digital assistant, an internet-connected mobile telephone or other common network node. While a remote computer 249 typically includes many or all of the elements described above relative to the computer system 220, only a memory storage device 250 has been illustrated in FIG. 6. The logical connections depicted in the FIG. include a local area network (LAN) 251 and a wide area network (WAN) 252. Such networking environments are commonplace in offices, enterprise-wide computer networks, intranets, and the internet.

When used in a LAN networking environment, the computer system 220 is often connected to the local area network 251 through a network interface or adapter 253. When used in a WAN networking environment, the computer system 220 typically includes a modem 254 or other means for establishing high-speed communications over WAN 252, such as the internet. Modem 254, which may be internal or external, is connected to system bus 223 via USB interface 246. In a networked environment, program modules depicted relative to computer system 220, or portions thereof, may be stored in the remote memory storage device 250. It will be appreciated that the network connections shown are exemplary and other means of establishing a communications link between the computers may be used.

Program modules may be stored on hard disk 227, optical disk 231, ROM 224, RAM 225, or even magnetic disk 229. The program modules may include portions of an operating system 240, application programs 236, or the like. A PTD database 238 may be included, which may contain predefined temperature differentials associated with one or more temperature sensor locations in proximity to the air intake of a rack system. A airflow mode database 239 may also be included, which may contain parameters and procedures for selecting potential airflow modes consistent with temperatures at the air intake of the rack system.

Aspects of the present invention may be implemented in the form of application program 236. Application program 236 may be informed by or otherwise associated with PTD database 238 and/or the airflow mode database 239. The application program 236 generally comprises computer-executable instructions for monitoring and analyzing temperatures at the air intake of the rack system, and detecting and diagnosing symptoms of recirculation and other airflow anomalies in the rack system.

The terms "comprising," "including," and "having," as used in the claims and specification herein, shall be considered as indicating an open group that may include other elements not specified. The terms "a," "an," and the singular forms of words shall be taken to include the plural form of the same words, such that the terms mean that one or more of something is provided. The term "one" or "single" may be used to indicate that one and only one of something is intended. Similarly, other specific integer values, such as "two," may be used when a specific number of things is intended. The terms "preferably," "preferred," "prefer," "optionally," "may," and similar terms are used to indicate that an item, condition or step being referred to is an optional (not required) feature of the invention.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of analyzing air intake temperatures at a component rack housing a plurality of heat-generating components, comprising:

flowing air through the component rack from an air intake of the component rack to an air exhaust panel of the component rack;

sensing the temperature at a plurality of positions within a zone of interest at the air intake;

identifying that one or more temperature differentials between selected positions in the zone of interest exceeds an associated threshold for at least a predetermined time period; and identifying an airflow recirculation mode according to the selected positions and the temperature differentials between the selected positions.

2. The method of claim 1, wherein the selected positions include two or more of an upper end, a lower end, a left side, and a right side of the air intake.

3. The method of claim 1, further comprising:

outputting a temperature distribution signal relating the sensed temperatures with the positions at which they are sensed.

4. The method of claim 3, further comprising:

displaying a visual representation of the temperature distribution signal.

5. The method of claim 1, further comprising:

generating a signal indicating recirculation in proximity to a first location in response to identifying that a temperature sensed at the first location is greater than a temperature sensed at a second location.

6. The method of claim 1, further comprising:

generating a signal indicating right-side recirculation in response to identifying that the temperature of at least one right-side position of the air intake exceeds the temperatures of at least one left-side position of the air intake by the associated threshold.

7. The method of claim 1, further comprising:

generating a signal indicating left-side recirculation in response to identifying that the temperature of at least one left-side position of the air intake exceeds the temperature of at least one right-side position of the air intake by the associated threshold.

8. The method of claim 1, further comprising:

generating a signal indicating upper-level recirculation in response to identifying that the temperature of at least one upper position of the air intake exceeds the temperature of at least one lower position of the air intake by the associated threshold.

9. The method of claim 1, further comprising:

generating a signal indicating lower-level recirculation in response to identifying that the temperature of at least one lower position of the air intake exceeds the temperature of at least one upper position of the air intake by the associated threshold.

10. The method of claim 1, wherein the air intake is generally rectangular, and the temperature sensors include at least one temperature sensor positioned in proximity to each corner of the air intake.

11. The method of claim 1, further comprising adjusting one or more data center parameters in relation to the identified airflow recirculation mode.

12. The method of claim 11, wherein the one or more data center parameters are selected from the group consisting of a component location, a rack location, a blower speed, a workload distribution, a processor load, and a component power state.

13. The method of claim 1, wherein each of the plurality of positions at which temperature is sensed corresponds to one of the plurality of heat-generating components.

14. The method of claim 1, further comprising identifying an airflow recirculation mode of a plurality of zones of interest and comparing the identified recirculation modes of the plurality of zones of interest to identify a combined recirculation mode.

15. A computer program product including computer usable program code embodied on a computer usable medium for diagnosing elevated temperature anomalies at the air intake to a component rack housing a plurality of heat-generating components through which air is flowing from an air intake of the component rack to an air exhaust panel of the component rack, the computer program product including:

computer usable program code for receiving signals representative of the temperature at a plurality of positions across the air intake;

computer usable program code for identifying that one or more temperature differentials between selected positions across the air intake exceeds an associated threshold for at least a predetermined time period; and computer usable program code for determining an airflow recirculation mode according to the selected positions and the temperature differentials between the selected positions.

* * * * *